United States Patent [19]  [11] 4,242,696
Diguet et al.  [45] Dec. 30, 1980

[54] METHOD OF FORMING A CONTACT ON THE SURFACE OF A SEMICONDUCTOR BODY BY SERIGRAPHY AND BODY OBTAINED BY MEANS OF THIS METHOD

[75] Inventors: Daniel Diguet; Gérard A. David; Pierre Aubril, all of Caen, France

[73] Assignee: U.S. Philips Corporation, New York, N.Y.

[21] Appl. No.: 967,940

[22] Filed: Dec. 11, 1978

[30] Foreign Application Priority Data

Dec. 13, 1977 [FR] France ............................. 77 37517

[51] Int. Cl.² .......................................... H01L 27/14
[52] U.S. Cl. ..................................... 357/30; 29/572; 29/590; 136/256; 252/514; 148/188
[58] Field of Search .................... 29/572, 589, 590; 357/30; 252/512, 514; 136/89 CC; 148/188

[56] References Cited

U.S. PATENT DOCUMENTS 3,743,538  7/1973  Mungaard ............................. 252/514
4,127,424  11/1978  Ullery ................................. 252/512

*Primary Examiner*—W. C. Tupman
*Attorney, Agent, or Firm*—Thomas A. Briody; Jack Oisher; Steven R. Biren

[57] ABSTRACT

A method of forming a contact on the surface of a semiconductor by a serigraphy treatment in which a doped conductive paste is provided in a first deposition, and then a second deposition containing no dopant is provided at least partly on the first deposition. Devices made in accordance with the invention are particularly suited for use as photovoltaic converters for solar radiation.

10 Claims, 3 Drawing Figures

METHOD OF FORMING A CONTACT ON THE SURFACE OF A SEMICONDUCTOR BODY BY SERIGRAPHY AND BODY OBTAINED BY MEANS OF THIS METHOD

BACKGROUND OF THE INVENTION

The present invention relates to a method of forming a contact configuration for soldering a metal connection on a region of a surface of a semiconductor body, the said body comprising a zone of a given conductivity type which adjoins the said surface according to the said region, said method mainly comprising the provision by serigraphy on at least a part of the said region of a conductive paste which, in particular in a vitrifiable phase, comprises at least a metal which is finely divided and a doping element which has the same conductivity type, the said paste is then vitrified thermally in such circumstances that the said dopant migrates in at least a surface part of the said region.

The present invention also relates to making a contact on the rear face of semiconductor solar cells and to the cells obtained by means of the method.

It is known that nowadays intensive investigations are performed in numerous laboratories to find means to reduce the cost of photovoltaic solar generators. Besides the high prices of the semiconductor material itself, certain steps in the manufacture of the solar cells prevent a price reduction if the methods used nowadays are maintained. This applies in particular to the step of making contact on each face of the cells, which is carried out by deposition by evaporation in a vacuum according to tested techniques which are adapted to applications of solar energy in space.

The replacement, whenever possible, of the said evaporation technique which is considered to be too expensive by a technique which can be automated more easily and operates with less expensive materials is considered as a measure of industrial and economical value by those skilled in the art. It is known that the use of conductive pastes which are provided on solar cells by serigraphy could form a solution to the problem called for especially from a point of view of the endeavored saving. For example, the article by M. B. Field and L. R. Scudder issued after the 12th Conference of Specialists of Photovoltaic Energy in Baton Rouge—United States—IEEE Proceedings 1976, p. 303—deals with investigations carried out in this direction. The method which consists of forming a contact on a region of the surface of a semiconductor body, for example, on the rear face of a solar cell (that is to say the face opposite to the photo-sensitive face) by use of the serigraphy technique involves numerous difficulties, including the difficulty of the subsequent soldering to a connection lug when a high percentage of the dopant is introduced in the conductive paste, or the non-ohmic character of the contact with high contact resistance when a comparatively low percentage of the said dopant is introduced in the said paste.

Another difficulty, found by applicants, is that the presence of the dopant in the vitrified deposit of the contact exerts an adverse influence. The mechanical behavior of a connection soldered to the vitrified deposit decreases in a non-acceptable manner when the device is exposed to environmental stresses. The life expectancy of the solar energy generator forms a factor which is indispensible and hence of great importance.

SUMMARY OF THE INVENTION

One of the objects of the invention is to mitigate these drawbacks and to make the technique of serigraphy useful for making contacts on the surface of a semiconductor body and in particular on a solar cell.

The present invention takes into consideration that the contact configuration on the surface of a semiconductor device had several functions which can be dissociated from each other.

According to the invention, a method of forming a contact configuration for soldering a metal connection on a region of a surface of a semiconductor body, which body has a zone of a given conductivity type which adjoins the said surface according to the said region, which method mainly comprises the provision by serigraphy on at least a part of the said region of a semiconductor paste, in particular in a vitrifiable phase, at least a metal which is finely divided and a dopant which gives the same conductivity type, then thermally vitrifying the said paste in such circumstances that the said dopant migrates in at least a surface part of the said region, is characterized in that after providing the conductive paste with the dopant in a first deposition and after at least partially drying the said first deposition, a second deposition with a semiconductor paste containing notably, in a vitrifiable phase, at least a principal metal and being substantially free from the said dopant is carried out facing at least a restricted part of the said region containing the location where the said connection is to be soldered, at least a part of the second deposition bearing on a part of the first deposition, the assembly of the two depositions forming the said contact configuration and the vitrification being then carried out.

The advantage of the method according to the invention is that it results in a contact configuration which has excellent electric properties, very good mechanical behavior in difficult climatological conditions, and finally an excellent solderability in the usual operating condition.

In the method according to the invention the surface opposite to which the said second deposition is localized preferably has an area smaller than 20% of the said region and preferably smaller than only 5% of the said region. The device then shows electrical properties which are very readily compatible with those of the devices obtained according to the known methods.

In a first embodiment of the invention the first deposition is provided on the major part of the said region and the said second deposition is provided on the said first deposition.

In a second embodiment of the invention in which the first deposition is provided on the said region, at least one recess is provided in the soldering place. The said second deposition which extends over a part of the first deposition then also extends on the surface of the body in the said recess.

The first embodiment is more favorable due to its simplicity. It permits locally reducing the average concentration of the dopant at the location for soldering the connection with respect to the remainder of the configuration, which improves both the solderability in the said location and the mechanical resistance of the soldering place against ageing, while elsewhere the first deposition has a good electric contact with the semiconductor material.

In the second embodiment of the invention the advantage is obtained, at the expense of an alignment step, that the concentration of a dopant in the part of the contact configuration which is provided for soldering the connection is nil. The quality of the soldered joint then is optimum independent of the concentration of dopants in the first deposition.

The said second deposition is preferably formed in a thickness which is noticeably larger than that of the said first deposition, which even increases the long life of the soldered joint under heavy environmental stress.

The vitrification treatment of the first and second depositions is preferably carried out simultaneously at a temperature between 600° and 750° C.

The invention also relates to a device, in particular for the photovoltaic conversion of solar radiation and resulting from the above-described method, which is characterized in that the zone of the body on which the contact is made is of p-type silicon, the metal being silver (or also Cu) and the said dopant being aluminium (or also Ga or Pd).

BRIEF DESCRIPTION OF THE DRAWING

The invention will now be described in greater detail, by way of example, with reference to the accompanying drawings, in which.

DETAILED DESCRIPTION

Figure 1:
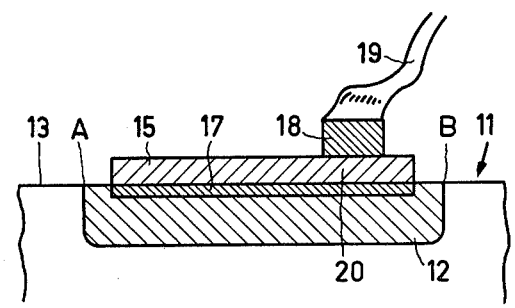
FIG. 1 is a diagrammatic cross-sectional view of a first embodiment of a contact configuration formed at the surface of a semiconductor body by the method according to the invention.

FIG. 1 shows a part of a semiconductor body 11 which is provided with, for example, a zone 12 of the p-type. The zone 12 adjoins the surface 13 of the device in a region which is shown in cross-section by the boundaries A and B. For making an electric contact with the zone 12 it is of particular importance if the said zone 12 shows a small concentration of impurities to divide this contact over the greater part of the surface AB and simultaneously to perform an increase in the concentration of impurities at the surface of the said zone 12 so that the contact becomes ohmic. Thus be serigraphy via a suitable screen of a known type a first deposition 15 of a conductive paste is provided which, in addition to the usual elements (solvent, organic binder, meltable glass, metal which is finely divided and is selected for its electrical and soldering qualities) comprises a doping element which during a later thermal treatment migrates in a surface layer 17 of the zone 12 so as to enhance the concentration of impurities. According to the inventin, after providing and at least partially drying said first deposit 15, a local second deposit 18 is provided of a conductive paste which is obtained by serigraphy and which for the second deposit is substantially free from dopants. The second deposit 18 is situated opposite to a restricted part of the region AB. It is destined for contact, by soldering, with the connection lug 19.

In the embodiment of the method which is illustrated by the example of FIG. 1, the first deposition 15 of the conductive paste is provided uniformly on the greater part of the region AB, while the second deposition 18 is obtained on the first deposition 15 by serigraphy. This method permits obtaining a concentration of doping elements in the first deposition 15 which is sufficiently high to obtain between said deposition and the semiconductor of the zone 12 a contact having good ohmic characteristic features, which concentration, however, is low enough that the migration of the said doping element in the second deposition 18 does not spoil the solderability of the connection lug 19 during the thermal vitrification treatment. The migration of the doping element from the part 20 of the first deposition 15 to the deposition 18 presents the advantage that the overall concentration of doping elements remains small in the assembly of the deposition 18 and of the part 20. So in the contact configuration which consists of the assembly of the two deposition 15 and 18, the actual contact function with the semiconductor body and the soldered joint function to the metal connection have been dissociated. This is very favorable to ensure a very strong mechanical joint even under heavy environmental stress, and also to obtain a perfect solderability of the connection.

Within the limits of the part 20 of the first deposition 15 the electric contact with the semiconductor may be deficient because the concentration of doping impurities is low, as has been explained above. According to the invention this does not involve substantially any measurable consequences because the second deposition 18 has a restricted area with respect to the region AB. Advantageously, this area is smaller than 20% of the said region and preferably it is even smaller than 5%. Furthermore, the geometric shape itself of the second deposition 18, in as far as it is narrow and long, may further contribute to the reduction of the conduction resistance in the part of the semiconductor material of the zone 12 which is situated perpendicularly below the second deposition 18.

By way of example, the semiconductor body 11 is of silicon, the zone 12 is of the p-type having a substantially homogeneous concentration of impurities in the order of $10^{16}$ at/cm$^3$. The first deposition 15 is provided by serigraphy of a silver paste of a known type which is commercially available and mainly comprises: silver powder as the main metal, a passive material of the sealing glass type, generally a zinc borosilicate, a temporary organic connection agent, for example ethylcellulose with suitable thixotropic properties and a solvent, for example terpineol to which paste 0.8 to 2% by weight of aluminum powder have previously been added as a doping element. The serigraphy screen used is of stainless steel wire having a diameter of 60 micrometers which has been woven to meshes with sides of 100 micrometers.

The first deposition 15 is dried for a few minutes at approximately 250° C. so as to remove the solvent present in the deposition. A second deposition 18 is then provided by localized serigraphy with a silver paste which is similar to the first with the difference that no aluminum powder has been added to it. The second deposition in turn is dried by a treatment of the device at 150° C., after which the device is heated to 400° C., so as to remove the organic binder from the assembly of deposition. Finally, a vitrification heating at a temperature preferably between 600° and 750° C. for approximately 15 minutes is carried out, during which treatment a part of the aluminium in the first deposition 15 reacts with the surface of the silicon so as to form after cooling the skin 17 of silicon which is rich in aluminum. The connection lug 19 which, for example, is of tin-plated copper can very readily be soldered on the second deposition 18 by means of a suitable alloy of Pb-Sn.

In the example of the application of the method according to the invention just described, the silver paste might be replaced by a copper paste. On the other hand, aluminum might be replaced, for example, by gallium, or also by palladium.

Figure 2:
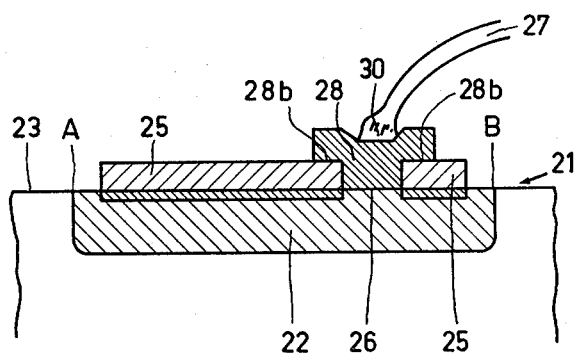
FIG. 2 is a diagrammatic cross-sectional view of a second embodiment of a contact configuration formed by the method according to the invention.

FIG. 2 relates to a modified embodiment of the method according to the invention.

The zone 22 which, for example, is of the p-type, adjoins the surface 23 of the body 21 according to the region AB which is shown in the cross-sectional view of FIG. 2. In this particular and favorable embodiment of the invention the first deposition 25 of a vitrifiable conductive paste with an addition of doping element is provided on the greater part of the region AB with the exception of a location which corresponds substantially to that to which the connection 27 will be soldered; in this location the deposition 25 has a recess 26. The said recess is obtained in known manner by incorporating a mask suitable for the serigraphy screen. The method is carried out in a manner analogous to that described with reference to the example of FIG. 1, with the proviso that the second deposition 28 of conductive paste which is free from doping elements is localized near the recess 26 in the first deposition 25. As a matter of fact, the second deposition 28 extends both in the recess 26 where the said second deposition bears on the surface of the semiconductor of the zone 22 and over a zone 28b which adjoins the said recess where the said second deposition 28 then bears on the first deposition 25. According to this modified embodiment of the method the deposition obtained by serigraphy contains no doping elements at the location of the recess 26, which provides the advantage that in this location the connection 27 can be provided by soldering so that an optimum strength of the soldered joint is obtained because no perturbation whatsoever by the doping element can occur. The zone 28b on which the two depositions obtained by serigraphy cover each other ensures the electric continuity of the contact between the zone 22 and the connection 27. At the location of the recess 26 the contact between the second deposition 28 and the material of the region 22 is electrically inactive.

The inactivity of a part of the contact configuration does not involve any adverse consequences, as already explained, because, according to the invention, the second deposition 28 has a very restricted area with respect to the region AB on which the contact configuration is to be formed. Another advantage of this method of the invention is formed by the fact that the concentration of doping elements in the first deposition 25 can be increased at will without any risk of falling back in the difficulties of the known technique. In the case of the silver paste, for example, up to 15% aluminum may be used without any inconvenience.

The second deposition 28 is preferably realized in a thickness which is considerably larger than that of the first deposition 25, which moves the soldered joint 30 of the connection 27 farther away from the surface of the zone 22 and increases the rigidity of the mechanical connection. If, for example, the first deposition 25 is realized in a typical thickness of 10 micrometers, it is attempted to obtain approximately 20 micrometers for the thickness of the second deposition 28.

Figure 3:
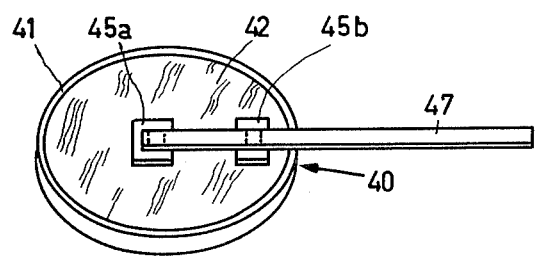
FIG. 3 is a plan view of the use of the method according to the invention upon making a contact on the rear face of a solar cell.

FIG. 3 relates to an application of the method according to the invention in making contact on the rear surface of a cell of silicon. The cell 40 which is circular has a photosensitive surface on the side not visible in the figure, while the opposite surface 41 on the major part thereof comprises a conductive contact deposition 42. In fact, this deposition is provided on original semiconductor material, that is to say having a low concentration of doping impurities; it is therefore conventional in the art to distribute the contact material maximally on the rear surface 41 so that the internal resistance of said cell is reduced as much as possible. In the example described the deposition 42 is provided by serigraphy of a conductive paste which comprises a doping element and enables an ohmic contact of low resistance on the original semiconductor material. According to the invention a second deposition of conductive paste is provided by means of an extra serigraphy treatment, which treatment is restricted to the two faces 45a and 45 b. According to one of the characteristic features of the invention this second deposition is carried out with a conductive paste comprising no doping element. The connection lug 47 of tin-plated copper is soldered afterwards in the center of the faces 45a and 45b by means of a standard alloy of lead and tin.

The operations which otherwise enable the cell to be obtained with the usual characteristic properties are well known in the art.

The contact configuration of the photosensitive front face can be obtained, for example, by means of the conventional method of vacuum deposition of titanium and silver via a metal mask to ensure the usually cut shape of the contact. In this case it is advantageous first to realize the deposition of conductive paste on the rear face of the cell, to perform the thermal treatment of said paste including the vitrification at a temperature in the order of 600° to 750° C., then to perform the deposition of tin and silver on the front face of the cell succeeded by firing at approximately 450° C. As a result of this sequence of operations the metallization of the front face is not subjected to a useless treatment at high temperature, which treatment might spoil the electrical qualities of the photosensitive zone. The electric connection may then be soldered on the two faces of the cell.

Although the method according to the invention is particularly readily adapted to the provision of a contact on the rear face of solar cells, it may in addition be used for other semiconductor devices when an electric zone of rather large dimensions is to be connected to another circuit, while the said zone has a low concentration of impurities at its surface.

Of course the invention is not restricted to the above-described embodiments shown from which other embodiments and other methods might be derived without departing from the scope of the present invention.

What is claimed is:

1. A method of forming a contact configuration for soldering a metal connection on a region of a surface of a semiconductor body having a zone of a given conductivity type which adjoins said surface at said region, said method comprising the provision by serigraphy on at least a part of said region of a conductive paste which, in a vitrifiable phase, comprises at least a metal which is finely divided and a doping element which gives the same conductivity type, said plate then being vitrified thermally such that said dopant migrates in at least a surface part of said region, characterized in that after providing the conductive paste with the doping element in a first deposition and after at least partly drying said first deposition, a second deposition with a conductive past containing, in a vitrifiable phase, at least a principal metal and being substantially free from said doping element is carried out at least at a restricted part of said region comprising the location where said connection is to be soldered, at least a part of the second deposition bearing on a part of the first deposition, the assembly of the two depositions forming said contact configuration and the vitrification being then carried out.

2. A method as claimed in claim 1, characterized in that the surface opposite to which said second deposition is located has an area which is smaller than 20% of said region.

3. A method as claimed in claim 2, characterized in that said surface has an area which is smaller than 5% of said region.

4. A method as claimed in claim 1, 2 or 3, characterized in that said first deposition is provided on the major part of said region, and said second deposition is provided on said first deposition.

5. A method as claimed in claim 1, 2 or 3, characterized in that said first deposition is provided on said region, at least a recess is provided in said soldering place and that said second deposition which extends over a part of the first deposition is realized in such manner as to also extend on the surface of the body at the location of said recess.

6. A method as claimed in claim 1, 2 or 3, characterized in that said second deposition is carred out in a thickness which is considerably larger than that of the said first deposition.

7. A method as claimed in claim 1, 2 or 3, in which said semiconductor is silicon, said major metal is silver and said doping element is aluminum, characterized in that the ratio between the aluminum present in said doped conductive paste is between 0.8 and 15%.

8. A method as claimed in claim 4 in which said semiconductor is silicon, the said principal metal is silver and the said doping element is aluminum characterized in that the proportion of aluminum dispersed in the said doped conductive paste is between 0.8 and 2%.

9. A method as claimed in claim 1, 2 or 3, characterized in that the vitrification of said first and second depositions is carried out simultaneously at a temperature between 600° and 750° C.

10. A semiconductor device for the photovoltaic conversion of solar radiation according to the method as claimed in claim 1, 2 or 3, characterized in that said zone of the body is silicon of the p-type, said metal is silver and said doping element is aluminum.

* * * * *